(12) United States Patent
Lee et al.

(10) Patent No.: US 8,129,654 B2
(45) Date of Patent: Mar. 6, 2012

(54) DC ARC PLASMATRON AND METHOD OF USING THE SAME

(75) Inventors: Heon-Ju Lee, Jeju-shi (KR); Yong-Son Mok, Jeju-Shi (KR); Valentin Anatolievich Riaby, Moscow (RU); Valdim Yu Plaksin, Istra of Moscow Region (RU)

(73) Assignee: Cheju National University Industry Academic Cooperation Foundation, Jeju-shi (KR)

( * ) Notice: Subject to any disclaimer, the term of this patent is extended or adjusted under 35 U.S.C. 154(b) by 489 days.

(21) Appl. No.: 12/295,000

(22) PCT Filed: Dec. 26, 2006

(86) PCT No.: PCT/KR2006/005693
§ 371 (c)(1),
(2), (4) Date: Oct. 21, 2008

(87) PCT Pub. No.: WO2007/114556
PCT Pub. Date: Oct. 11, 2007

(65) Prior Publication Data
US 2010/0201271 A1 Aug. 12, 2010

(30) Foreign Application Priority Data
Apr. 4, 2006 (KR) .................. 10-2006-0030688

(51) Int. Cl.
*B23K 10/00* (2006.01)
(52) U.S. Cl. .......... 219/121.36; 219/121.5; 219/121.51; 219/121.52; 313/231.41
(58) Field of Classification Search ............. 219/121.36, 219/121.39, 121.45, 121.48, 121.5, 121.51, 219/121.59, 74, 75; 313/231.21, 231.41, 313/231.51; 315/111.21
See application file for complete search history.

(56) References Cited

U.S. PATENT DOCUMENTS

| 3,051,639 | A | 9/1958 | Anderson |
| 4,035,684 | A | 7/1977 | Svoboda et al. |
| 4,596,918 | A | 6/1986 | Ponghis |
| 5,660,743 | A | 8/1997 | Nemchinsky |
| 6,114,649 | A | 9/2000 | Delcea |
| 6,515,252 | B1 | 2/2003 | Girold |

FOREIGN PATENT DOCUMENTS
KR 100199782 6/1999

OTHER PUBLICATIONS
ISR for PCT/KR2006/005693 dated Mar. 20, 2007.

*Primary Examiner* — Mark Paschall
(74) *Attorney, Agent, or Firm* — Kile, Park, Goekjian, Reed & McManus PLLC

(57) ABSTRACT

The present invention relates to a plasmatron structure for heating working gas in a DC arc discharge at the atmospheric or lowered pressures and can be used for different electronic, engineering, or vehicle-building industries and for medicine. An object of the invention is to provide improved effectiveness of process gas activation and increased completeness of plasma-chemical reactions. These objects are achieved in a DC arc plasmatron comprising a rod cathode, a nozzle anode having a body member and a through axial orifice, a power supply unit connected to both electrodes, and a gas system for feeding plasma-forming gas into inter-electrode space and supplying suitably selected technologic gas or gas mixture into the anode orifice through an internal opening communicating with said orifice and positioned between its inlet and outlet parts. In the plasmatron according to the invention, said opening is configured as a continuous circular axial gap between said parts of said anode orifice, while the size of said gap can be smaller or larger than the diameter of the inlet part of said anode orifice and the diameter of the outlet part of said anode orifice can also be smaller or larger than the inlet part of said anode orifice. In addition the inventive plasmatron can be successfully applied in vacuum conditions to extend lifetime of the activated process gas and to provide the clean treatment procedure.

8 Claims, 3 Drawing Sheets

[Fig. 1]
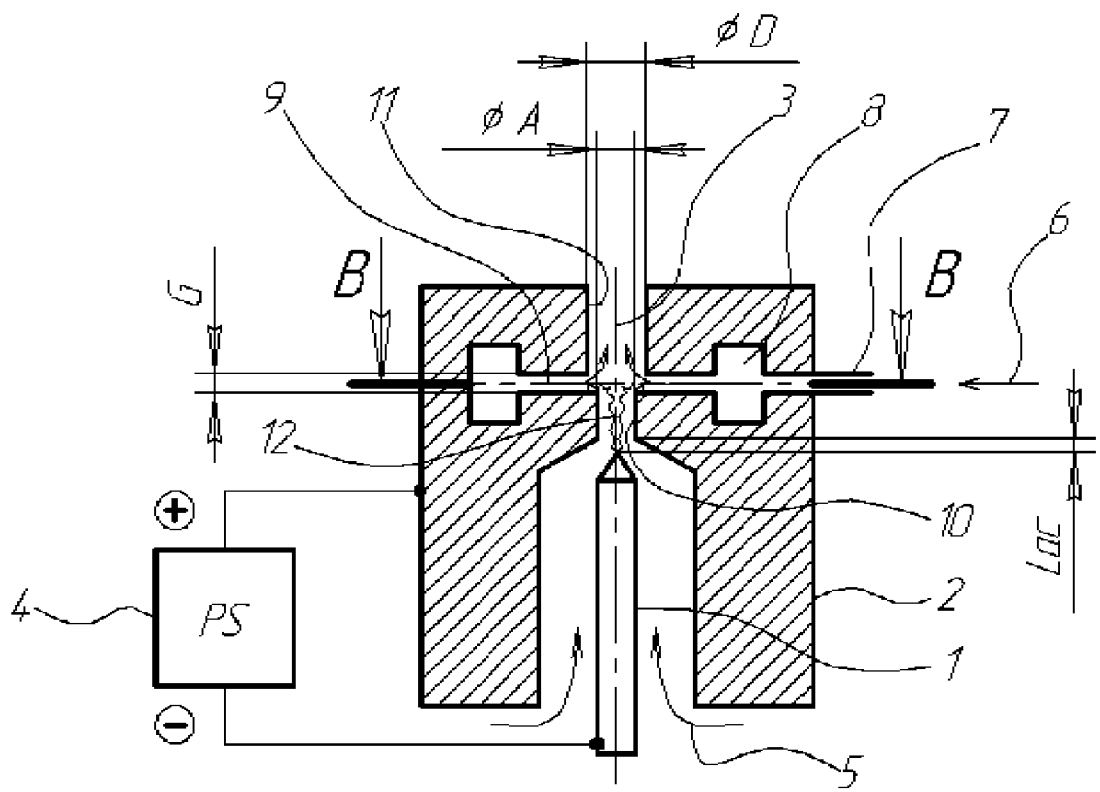
[Fig. 2]
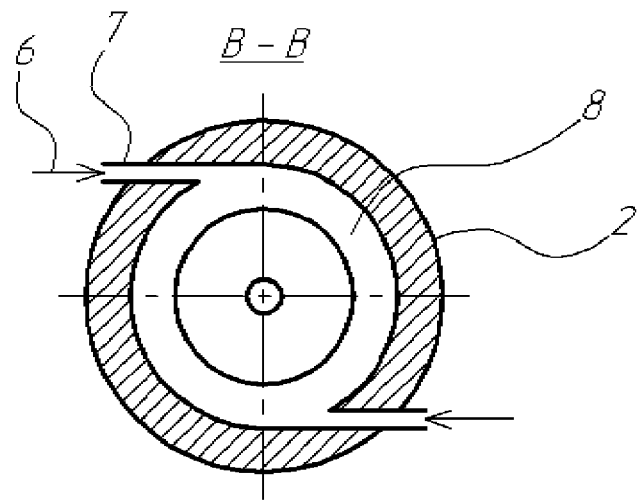

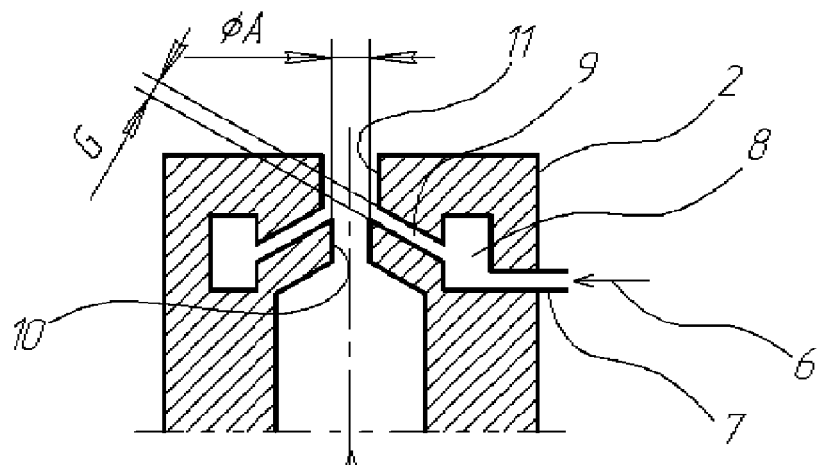
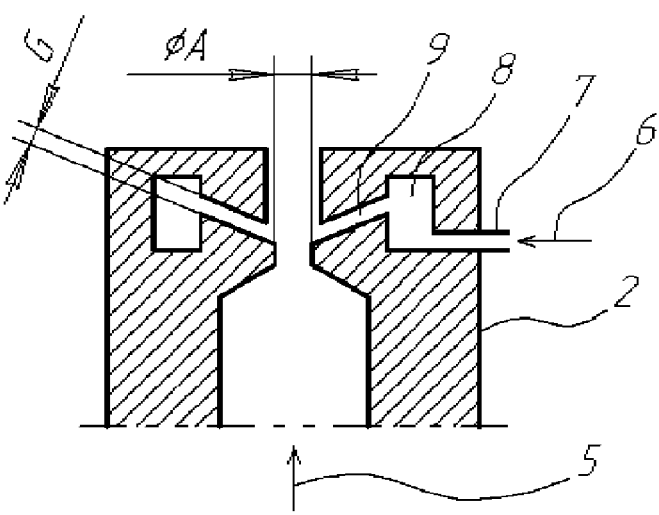
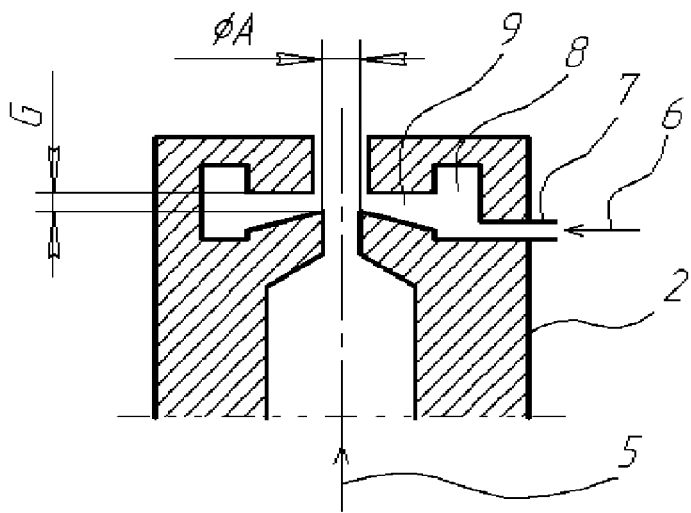

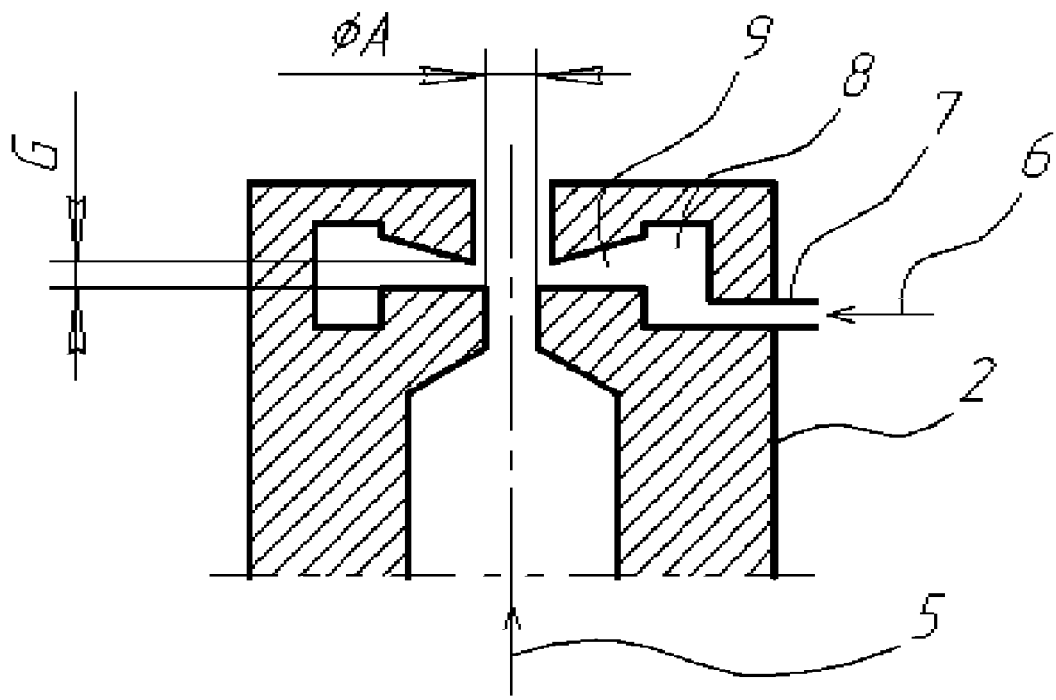
[Fig. 6]
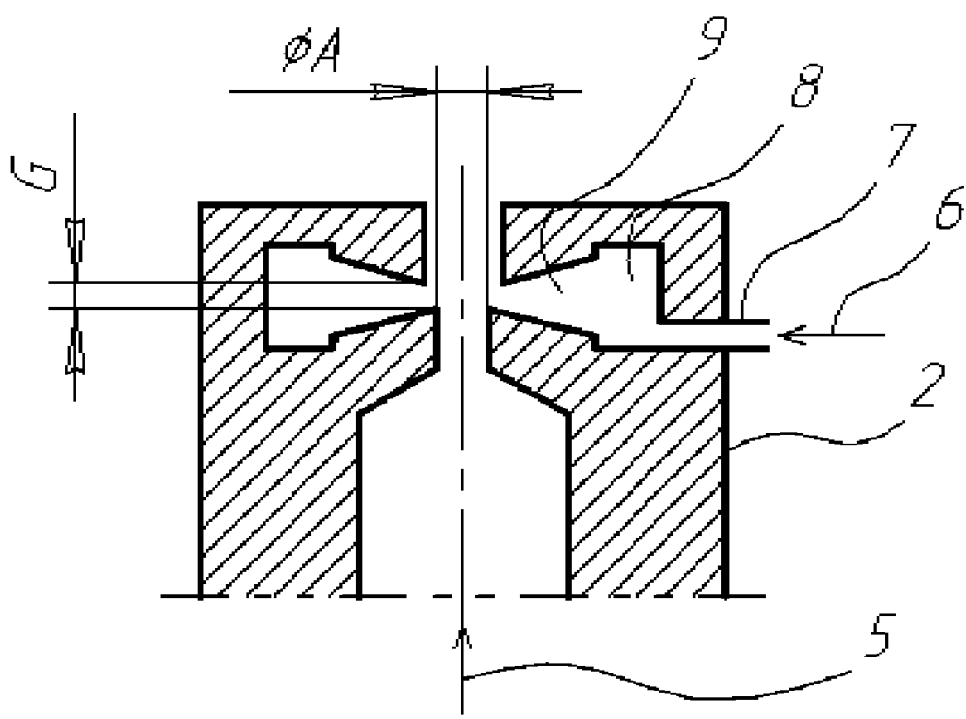
[Fig. 7]

US 8,129,654 B2

DC ARC PLASMATRON AND METHOD OF USING THE SAME

RELATED APPLICATIONS

The present application is based on International Application Number PCT/KR2006/005693 filed Dec. 26, 2006, and claims priority from Korean Application Number 10-2006-0030688 filed Apr. 4, 2006, the disclosures of which are hereby incorporated by reference herein in their entirety.

TECHNICAL FIELD

The present invention relates to a DC arc plasmatron and a method of using the plasmatron in vacuum for startup with an HV/HF oscillator.

More particularly, the invention relates to a plasmatron structure for heating working gas in a DC arc discharge at the atmospheric or vacuum pressures that can be used in electronic, engineering, or vehicle-building industries for plasma or plasma-chemical treatment of surfaces (cleaning, etching, deposition), cleaning vehicle/industrial exhausts, and in medicine for disinfection, sterilization of tools or biological objects, or applying hardening or protective coatings to increase wear resistance of tools or use organic coatings as bandages.

BACKGROUND ART

There have been widely known DC arc plasmatrons comprising a rod cathode, a nozzle anode having a body member and a central orifice, both electrodes being typically water-cooled, a power supply unit connected to the both electrodes, and a gas system for feeding plasma-forming gas into the inter-electrode space. Such DC arc plasmatrons have been disclosed in U.S. Pat. No. 3,051,639, 1962, by Anderson; U.S. Pat. No. 4,035,684, 1977, by Svoboda et al.; U.S. Pat. No. 4,569,918, 1986 of Ponghis; and U.S. Pat. No. 6,114,649, 2000, by Delcea. In such plasma sources the cathode is typically made of tungsten that, at temperature up to 3200° C., reaches the thermo-ionic emission mode with an erosion rate of about $10^{-9}$ g/C. This level of erosion is achieved only in contact with chemically inert plasma-forming gas like argon or nitrogen. Water-cooled anodes are destroyed much more intensively. In particular for copper that is often used to fabricate these parts, the erosion rate reaches $10^{-6}$ to $10^{-5}$ g/C which in turn limits service time of such plasmatrons to between $10^0$ and $10^1$ hours and results in a high level of plasma contamination with copper vapor and clusters. These factors limit wide use of these plasmatrons for technologic purposes especially in the field of electronics.

U.S. Pat. No. 6,114,649, 2000, by Delcea discloses ring members on the internal surface of the anode orifice. These rings cause circuit vortex to be formed on the internal surface of the anode that attracts arc roots, or spots, fix the length of the discharge and stabilize the discharge parameters. On the other hand, the arc spot mechanism in this situation remains without changes, keeping the anode erosion rate at the aforementioned level (this mechanism includes local melting and overheating of an anode spot and subsequent explosion that induce the metal drop and cluster formation).

U.S. Pat. No. 3,051,639, 1962, by Anderson discloses special refractory metal radial inserts fixed in an anode body member with internal ends of the inserts leveled flat with the anode internal surface. This approach intended to lower the anode erosion rate but its effect turned out to be relatively small because this anode embodiment was also proved unable to change the destructive mechanism of the constricted anode arc spots.

The aforementioned patent, U.S. Pat. No. 3,051,639, discloses a technology of plasma-chemical reformation of hydrocarbon fuel using an annular collector located around the anode orifice. Said collector is provided with external fuel feeding conduits and a plurality of internal circumferentially-disposed openings downstream of the above said refractory inserts; said openings connect said collector with the anode orifice. This technology failed to provide high ability for the process gas activation because heating plasma forming gas in the anode area was non-uniform due to constricted nature of the anode spots. Small sized hot anode spot areas achieved heating for only a small fraction of the total plasma flow. As a result, the effectiveness of plasma-chemistry in the torch was not sufficient.

There is known from all aforementioned patents a method of using the a DC arc plasmatron comprising the steps of selecting suitable technologic gas, switching on water cooling and gas supplying systems to the plasmatron and then exciting arc discharge between its anode and cathode using a high-voltage/high-frequency startup oscillator. This method based on electrical breakdown of the inter-electrode space does not work in vacuum: according to the Paschen law in vacuum the discharge damages the parts like soldered seams, and collects cathode chucks, thin non-cooled elements, etc., that are never designed to be exposed to the action of arc spots.

Analysis of the prior art technologies shows that the technical decisions described in U.S. Pat. No. 3,051,639, 1962, by Anderson are the closest one with respect to the present invention. That is why it was selected as a reference.

DISCLOSURE OF INVENTION

Technical Solution

It is an object of the invention to provide a plasmatron with improved effectiveness of process gas activation and increased intensity and completeness of plasma-chemical reactions therein. It is another object of the invention to provide a plasmatron with increased service time, high purity of generated plasma flow and possibility to operate it in vacuum with extended life time of the activated state for the technologic gas. and providing the clean technologic process.

The aforementioned objects of the invention are achieved in a DC arc plasmatron comprising a rod cathode, a nozzle anode having a body member and a through axial orifice, a power supply unit connected to the both electrodes, and a gas system for feeding plasma-forming gas into the inter-electrode space and supplying a suitably selected technologic gas or gas mixture into the anode orifice through an internal opening communicating with said orifice and positioned between its inlet and outlet parts. In the described plasmatron according to the invention said opening is configured as a continuous circular axial gap between said parts of said anode orifice, while the size of said gap can be smaller or larger than the diameter of the inlet part of said anode orifice and the diameter of the outlet part of said anode orifice can also be smaller or larger than the inlet part of said anode orifice. In addition, within the scope of the invention said anode can be configured such that the ratio of the size G of said technologic gap to the diameter A of the inlet part of said anode orifice is between 0.3 to 3; said anode can be configured such that the ratio of the diameters D to A of the outlet and inlet parts of said anode orifice, respectively, is between 0.3 to 3; said circular gap can be formed as a vortex injector; said vortex injector can have tangent inlet holes; said vortex injector can have a supplying auger at its inlet; the internal surface of said gap can be made flat, conical or a combination of said shapes to direct technologic gas normal or at some angles to the axis thus providing wake or cross flow of technologic gas with respect to the axial movement of the plasma-forming gas.

Said objects of the invention are also achieved by a method of using the plasmatron according to the invention, comprising the steps of selecting a suitable technologic gas, switching on water-cooling and gas supply systems to the plasmatron and then exciting arc discharge between its anode and cathode. According to the present invention the aforementioned steps are carried out at the atmospheric pressure in the arc area, then process parameters are adjusted to a given level and said area is evacuated through the anode orifice while keeping continuously said process parameters until a suitable vacuum pressure in the treatment zone is reached.

BRIEF DESCRIPTION OF THE DRAWINGS

The features and advantages of the present invention will be evident from the following detailed description of the preferred embodiments of the present invention and in conjunction with the accompanying drawings in which:

FIG. 1 is a schematic front elevation view of a plasmatron according to the invention;

FIG. 2 is a schematic view of the B-B cross-sectional area;

FIGS. 3-7 are schematic front elevation views of the plasmatron according to the invention showing exemplary variants of the embodiment for the circular gap within the anode body member.

The following reference numbers are applied in the drawings: 1—cathode, 2—anode body member, 3—anode through axial orifice, 4—power supply, 5—neutral gas supply, 6—technologic gas supply, 7—inlet conduit for the technologic gas, 8—circular collector for the technologic gas, 9—continuous circular gap, 10—inlet part of the anode orifice, 11—outlet part of the anode orifice, 12—positive column of the arc discharge, $L_{ac}$—inter-electrode distance.

For simplicity purposes, water cooling means, an inter-electrode insulator, and other conventional plasma torch engineering means have been purposely omitted in all the figures herein.

The schematic diagram in FIG. 1 shows an inventive plasmatron that differs from other conventional plasmatrons with a continuous circular gap 9 communicating with the circular collector 8 via the anode through orifice 3 in the area between an inlet 10 and an outlet 11 parts of the orifice 3. The cold technologic gas flow meets plasma-forming gas that has been heated in the arc positive column 12 and in the arc anode spot. Interaction between two gas flows results in forming circular vortex that presumably serves as a distributed anode arc spot with a low arc current density. High energy of the hot plasma-forming gas is transferred to the technologic gas in the presence of said vortex which results in the activation of the technologic gas: a dissociation of the gas molecules, an excitation of dissociated fragments and atoms with subsequent ionization. Said phenomenon helps to enhance the intensity of plasma chemical reactions within the technologic gas flow and thus to achieve the main purpose of the present invention, that is, increasing effectiveness and completeness of the plasma chemical reactions in the anode orifice.

FIG. 2 shows a circular collector 8 of the plasmatron with the tangential inlet conduits 7 for creating vortex motion of the technologic gas in the collector 8, circular gap 9, and eventually in the anode orifice 3. Such an arrangement of the technologic gas flow suitably increases the anode spot area of the plasmatron which can be useful for carrying out the plasma chemical processes in the proposed inventive plasmatron. Similar effect can be achieved using an auger at the inlet of the circular collector 8.

FIGS. 3-7 show variants of flat and conical surfaces forming the circular gap 9. In FIGS. 3 and 5 the technologic and plasma-forming gas forms a kind of wake flow in the anode orifice 3 while in FIGS. 4 and 6 forming a kind of cross flow. FIG. 7 shows a plasmatron with normal flow of the technologic gas with respect to the plasmatron axis. Such changes of the technologic gas flow in the circular gap 9 can suitably influence the arrangement of particular plasma chemical processes.

MODE FOR THE INVENTION

The proposed design of the anode body member 2 results in forming circular vortexes in the area where circular gap 9 communicates with the anode orifice 3. It is well known in the arc discharge physics (see for instance U.S. Pat. No. 6,114,649, 2000, by Delcea) that an anode spot is attracted with vortexes on the anode surface. Therefore the above mentioned intentionally generated vortex attracts arc anode spots to "smudge" or widen arc roots, distributing them over said circular surface which is much larger than the small surface where the conventional anode spots are concentrated. The concentrated anode spots cause the overheating of anode and quickly destroy bulk anode with an erosion rate of maximum $10^{-5}$ g/C.

The described distributed anode spot was not so far observed directly and reliably in an actual experiment. In accurate experimental studies, however, the inventive plasmatron showed that its anode erosion rate reached much lower level of about $10^{-10}$ g/C. The obtained value differs from the conventional level by five orders of magnitude. Such a large difference can be explained assuming only some new mechanism of the anode operation featuring a low arc current density in the anode spot due to well distributed geometry. This phenomenon remained unchanged when the ratio of the technologic gap G to the diameter A of the inlet part 10 of the anode orifice 3 as well as the ratio of the diameter D of the outlet part 11 of the anode orifice 3 to the same diameter A were varied in the wide range of $0.3 \leq (G/A) \leq 3$ and $0.3 \leq (D/A) \leq 3$.

Such a result implies that, if in an arc torch a tungsten cathode is used that operates in the thermo-ionic mode for which the erosion rate is about $10^{-9}$ g/C, then the service time of a plasmatron is determined only by the cathode erosion process and the overall lifetime of a plasmatron can easily reach 1000 hours. In addition, at arc currents not more than 100 A when the cathode erosion rate is stabilized at the level of about $10^{-7}$ g/s plasma contamination by tungsten vapor is kept so low that such plasma can be considered as spectrally clean.

In the proposed plasmatron interaction of the technologic gas with plasma-forming gas becomes more intensive as compared to the reference of the invention. The reason for this improvement is the continuous and presumably uniform structure of the distributed anode spots together with the adjoined hot vortex that fills virtually all cross-sections at the exit of the circular gap 9. In addition, after passing through this area, all technologic gas interacts with full plasma bulk of the positive arc column. As a result the degree of the technologic gas chemical activation and therefore the effectiveness and completeness of the plasma-chemical process in the plasmatron increase significantly.

The inventive plasmatron operates in the following steps. The water-cooling system and all gas supply systems are first switched on. Then power supply of the power unit is switched on and the start button is pressed. Arc discharge is then excited and arc current is adjusted to a given level. After that, all gas flow rates are adjusted according to a technologic task. When the process has been completed, arc is first switched off. Power supply to all the above systems is then cut off in the reversed order, water cooling being switched off last. If required, in the vacuum process to extend lifetime of the activated state of the process gas and to guarantee clean environment for a particular treatment procedure like the diamond-like film deposition, according to the present invention the working cycle begins from the plasmatron startup at the atmospheric pressure, then process parameters are adjusted to a suitable level and the arc area is evacuated through the anode orifice 3 while keeping previously set process parameters until suitable vacuum pressure in the treatment zone is reached.

Comparison with the Best Sample

Technical effectiveness of the present invention was compared experimentally with the DC Arc Plasmatron Device described in the Korea Patent Application No. 10-2005-0009203, 2005, by H.-J. Lee et al.

The conditions of the experiment with the inventive plasmatron were as follows: cathode was made of thoriated tungsten Ø3.2 mm; anode was made of copper, the plasmatron parameters were as follows: A=2 mm, D=4 mm, $L_{ac}$=1.5 mm (for $L_{ac}$, see FIG. 1), technologic circular gap was made flat and has a height G=2 mm, the argon flow protecting cathode was rated at $Q_{AR}$ of 1 nl/min; arc current was 100 A at an arc voltage of 12-13 V. In the prior art plasmatron its geometric and discharge arc parameters were the same except for the specific technologic channel that was shaped straight and flat, and sized 3×14 mm. The anode erosion rate for both devices showed the same value of 4·10$^{-10}$ g/C, meaning that in both plasmatrons anode spots were highly effective and well distributed over their working surfaces.

Technologic process to be tested was Diesel fuel/air mixture reformation aimed at partial fuel oxidation. At the stoichiometric conditions this process should result in mixture of synthesis gas, i.e. carbon monoxide CO and hydrogen $H_2$ mixture (not considering nitrogen $N_2$ in the air that did not work in the chemical reactions). Said fuel/air mixture was supplied into the flat longitudinal technologic channel of the conventional arc torch and into the circular collector and the flat coaxial gap of the present invention with the following parameters: fuel flow rate of about 1.43 ml/min, air flow rate of about 7 nl/min (this mixture was lean; with the air flow rate of about 7 nl/min stoichiometric quantity of fuel should be 2.3 ml/min). Diesel fuel was atomized at the plasmatron inlet using a ready-made injector ⅛"AU Automatic Air Actuated Nozzle Assembly (commercially available from Spraying Systems Co., USA) and it was then ignited in contact with hot argon plasma. The mixture passed quick plasma-catalytic reformation that continued for some time in the reformation chamber (steel tube ID 11.5 mm, length 550 mm). The results of the reaction were checked with CO content measurements using 1HH GASTEC Detector Tubes that could determine CO content in the range $0 \leq x_{CO} \leq 50\%$: gas samples of 50 ml in volume were sucked into a syringe at the outlet of said reformation chamber and then pressed through the 1HH tube that showed CO content by change in color of the substance inside.

The following results were obtained: with the prior art plasmatron relative CO content was $x_{CO}$ ≈ 4% while with the plasmatron according to the invention the relative CO yield reached 4 times higher value $x_{CO}$ ≈ 16%. The last result means that in this experiment the plasmatron according to the invention provided full 100% of fuel reformation showing high effectiveness of process gas activation and the completeness of plasma chemical reactions therein.

The proposed method of using the inventive plasmatron was tested in a vacuum chamber at pressure of 3-5 Torr in the process of silicon and photoresist etching using $O_2$ and $CF_4$ plasmas as technologic gases. The plasmatron operated stably and etching was fast and not cause the defects at the rate of about 10☐/min.

It is understood that the plasmatron and the method according to the invention can be successfully applied to other configurations not described herein and to other homogeneous and heterogeneous processes other than fuel reformation or etching (for example for plasma chemical deposition).

Having described the embodiments of the invention, modifications will be evident to those skilled in the art without departing from the scope and spirit of the invention as defined in the claims following hereafter.

INDUSTRIAL APPLICABILITY

The plasmatron according to the invention can be used in the vehicle-production industry to clean exhaust gases in any internal combustion engines. It can be used for electronics in etching/deposition processes and auxiliary cleaning steps. It can also be used for medicine in sterilization or applying protective/hardening coatings on different objects.

The invention claimed is:
1. A DC arc plasmatron comprising:
a rod cathode,
a nozzle anode having a body member and a through axial orifice,
a power supply unit connected to both of the rod cathode and the nozzle anode, and
a gas system for feeding plasma-forming gas into a space between the rod cathode and the nozzle anode and supplying suitably selected functional gas into the anode orifice through an internal opening communicating with said anode orifice and positioned between inlet and outlet parts of said anode orifice,
wherein said internal opening is configured as an annular gap between said inlet and outlet parts of said anode orifice, while said annular gap has a predefined size relative to a diameter of the inlet part of said anode orifice and the outlet part of said anode orifice has a predefined diameter relative to the diameter of the inlet part of said anode orifice,
wherein said anode is configured such that the ratio of the size G of said annular gap to the diameter A of the inlet part of said anode orifice is between 0.3 to 3.
2. A DC arc plasmatron as claimed in claim 1, wherein said anode is configured such that the ratio of the diameters D to A of the outlet and inlet parts of said anode orifice respectively is between 0.3 to 3.
3. A DC arc plasmatron as claimed in claim 1, wherein said annular gap is formed as a vortex injector.
4. A DC arc plasmatron as claimed in claim 3, wherein said vortex injector has tangential inlet holes.

5. A DC arc plasmatron as claimed in claim 3, wherein said vortex injector has a supplying auger at its inlet.

6. A DC arc plasmatron as claimed in claim 1, wherein internal surfaces of said gap are shaped flat to direct functional gas at an angle relative to a principal axis of the orifice, thus providing wake or cross flow of functional gas with respect to the axial movement of the plasma-forming gas through the orifice.

7. A method of using said DC arc plasmatron as claimed in claim 1, comprising the steps of:
selecting a suitable functional gas;
switching on the gas system of the plasmatron; and
exciting an arc discharge between the anode and the cathode by applying a voltage between the anode and the cathode using the power supply unit,
wherein the above steps are carried out at atmospheric pressure in an arc discharge area, then process parameters are adjusted to a given level and the arc discharge area is evacuated through the anode orifice while keeping the above process parameters until suitable vacuum pressure in the arc discharge area is reached.

8. A DC arc plasmatron as claimed in claim 1, wherein internal surfaces of said gap are shaped conical to direct functional gas at an angle relative to a principal axis of the orifice, thus providing wake or cross flow of functional gas with respect to the axial movement of the plasma-forming gas through the orifice.

* * * * *